(12) United States Patent
Sakaray et al.

(10) Patent No.: US 12,382,604 B2
(45) Date of Patent: Aug. 5, 2025

(54) COOLING SYSTEM FOR ELECTRICAL COMPONENTS

(71) Applicant: Caterpillar Inc., Peoria, IL (US)

(72) Inventors: Umakanth Sakaray, Dunlap, IL (US); Pavan Kumar Reddy Kudumula, Dunlap, IL (US)

(73) Assignee: Caterpillar Inc., Peoria, IL (US)

( * ) Notice: Subject to any disclaimer, the term of this patent is extended or adjusted under 35 U.S.C. 154(b) by 241 days.

(21) Appl. No.: 18/309,973

(22) Filed: May 1, 2023

(65) Prior Publication Data
US 2024/0373584 A1 Nov. 7, 2024

(51) Int. Cl.
*H05K 7/20* (2006.01)
(52) U.S. Cl.
CPC ............................... *H05K 7/20145* (2013.01)
(58) Field of Classification Search
CPC ........... H05K 7/20145; H05K 7/20172; H05K 7/20736; H05K 7/20972; H05K 7/20009; H05K 7/20209; H05K 7/20563; H05K 7/20572; H05K 7/20909; H05K 9/0007; H05K 9/0041; G06F 1/20
USPC ......................................................... 361/695
See application file for complete search history.

(56) References Cited

U.S. PATENT DOCUMENTS

| | | | | |
|---|---|---|---|---|
| 7,885,066 | B2* | 2/2011 | Boyden | H05K 7/20563 361/679.5 |
| 10,037,062 | B1* | 7/2018 | Bhopte | G06F 1/183 |
| 10,411,556 | B1* | 9/2019 | Sakaray | F02B 77/11 |
| 12,133,352 | B2* | 10/2024 | He | H05K 7/20727 |
| 2010/0073872 | A1* | 3/2010 | Pakravan | H05K 7/20572 361/695 |
| 2012/0268890 | A1* | 10/2012 | Stock | G06F 1/20 361/679.53 |
| 2015/0156919 | A1* | 6/2015 | Schroedl | H05K 7/209 361/692 |
| 2021/0020347 | A1 | 1/2021 | Rong et al. | |
| 2021/0074091 | A1* | 3/2021 | Wang | B60Q 9/008 |
| 2021/0237310 | A1* | 8/2021 | Scott | B28C 7/067 |
| 2022/0061133 | A1* | 2/2022 | Gross | H05B 6/1209 |
| 2022/0183193 | A1* | 6/2022 | Hwang | H05K 7/20145 |
| 2022/0192047 | A1 | 6/2022 | Ibrahim et al. | |

FOREIGN PATENT DOCUMENTS

| | | |
|---|---|---|
| CN | 201450442 U | 5/2010 |
| CN | 203788630 U | 8/2014 |

* cited by examiner

*Primary Examiner* — Mandeep S Buttar
(74) *Attorney, Agent, or Firm* — Jeff A. Greene

(57) ABSTRACT

A cooling system for a plurality of electrical components is described. The cooling system includes a blower to generate an air flow and a platform to mount the plurality of electrical components. The platform defines a plurality of passages. The cooling system further includes an arrangement including a plenum extending between the blower and the platform to direct the air flow towards and around the plurality of electrical components through the plurality of passages.

19 Claims, 6 Drawing Sheets

COOLING SYSTEM FOR ELECTRICAL COMPONENTS

TECHNICAL FIELD

The present disclosure relates to a system and a method for cooling electrical components.

BACKGROUND

Electrical components, such as inductors, are widely used in a variety of electronic applications, such as power conversion devices, power supply devices, sensing systems, and the like. One of the challenges in designing electrical components is managing the heat generated from such electrical components, e.g., due to power losses in those electrical components. As an example, when a current flows through an electrical component, the current typically generates heat due to the resistance of a corresponding wire in the electrical component. This heat is generally required to be dissipated to prevent the electrical component from overheating and from reducing its lifespan. Moreover, such heat generated can also degrade one or more parts that may surround the electrical component, e.g., an insulation material layered around an inductor, leading to a reduced lifespan of such parts, as well.

United States Patent Publication No. 20220192047 relates to a power conversion apparatus including an AC port, at least one DC port, a chassis, at least one power conversion module mounted in said chassis connectable to off-board conductors and said AC and said at least one DC ports, a module heat sink attached to each one of said at least one power conversion module for cooling said module. The off-board inductors are mounted in said chassis together and separate from modules with one or more of an inductor heat sink and cooling fluid circulator for cooling said inductors.

SUMMARY

In an aspect, the present disclosure relates to a cooling system for a plurality of electrical components. The cooling system includes a blower to generate an air flow and a platform to mount the plurality of electrical components. The platform defines a plurality of passages. The cooling system further includes an arrangement including a plenum extending between the blower and the platform to direct the air flow towards and around the plurality of electrical components through the plurality of passages.

In another aspect, the present disclosure relates to a containerized energy storage system. The containerized energy storage system includes a plurality of electrical components and a container to house the plurality of electrical components. The container includes an inlet port to draw air into the container and an exhaust port to release air out of the container. The containerized energy storage system further includes a cooling system for the plurality of electrical components. The cooling system includes a blower to generate an air flow and a platform to arrange the plurality of electrical components. The platform defines a plurality of passages. The cooling system further includes an arrangement including a plenum extending between the blower and the platform to direct the air flow towards and around the plurality of electrical components through the plurality of passages.

In yet another aspect, the present disclosure relates to a method for cooling a plurality of electrical components. The method includes using a blower to generate an air flow and mounting the plurality of electrical components on a platform. The platform defines a plurality of passages. The method further includes providing an arrangement including a plenum extending between the blower and the platform to direct the air flow towards and around the plurality of electrical components through the plurality of passages.

BRIEF DESCRIPTION

DETAILED DESCRIPTION

Reference will now be made in detail to specific embodiments or features, examples of which are illustrated in the accompanying drawings. Wherever possible, the same reference numbers will be used throughout the drawings to refer to the same or the like parts.

Figure 1:
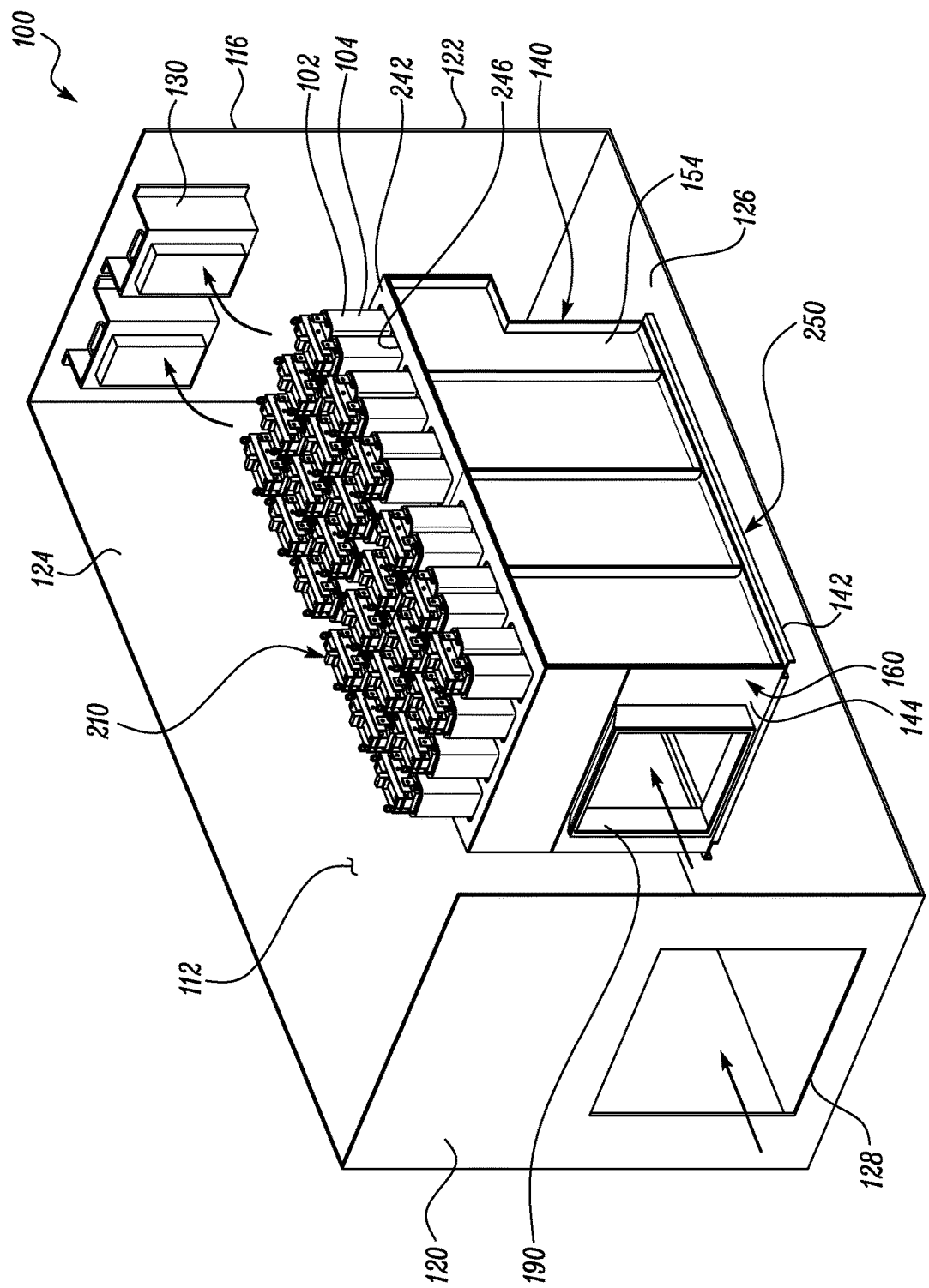
FIG. 1 is a containerized energy storage system having a cooling system for cooling electrical components, in accordance with an embodiment of the present disclosure.
Figure 2:
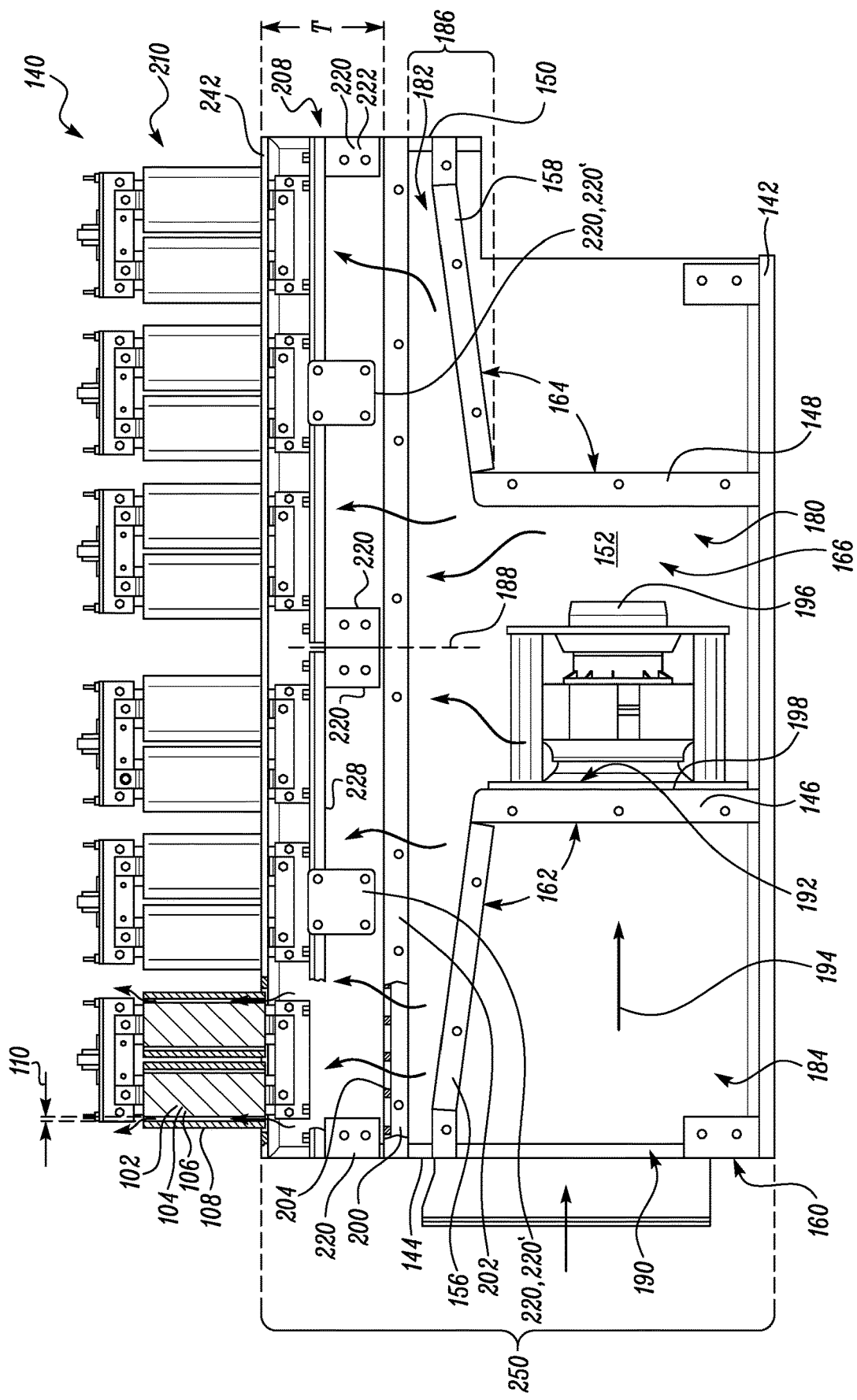
FIG. 2 is an interior view of the cooling system of the containerized energy storage system, in accordance with an embodiment of the present disclosure.

Referring to FIG. 1, an exemplary containerized energy storage system 100 is shown. The containerized energy storage system 100 includes a plurality of electrical components 102. The electrical components 102 may be one used in any electrical circuit (not shown). For example, but not limited to, the electrical components 102 may correspond to inductors 104. As shown in FIG. 2, each electrical component 102 may include a core 106 (e.g., an electrical core composed of electrical wires, etc.) and an outer sheath 108 surrounding and defining a clearance 110 with the core 106. Although the present disclosure includes discussions related to the inductor 104, it would be appreciated that the electrical component 102 may include any component that generates heat and requires cooling to operate efficiently.

Referring back to FIG. 1, the containerized energy storage system 100 may include a container 116 defining an inner volume 112 to house the electrical components 102. The container 116 may be a rectangular-shaped container having one or more walls, for example, a first container wall 120, a second container wall 122 opposite to the first container wall 120, and a third container wall 124 extending between the first container wall 120 and the second container wall 122, as shown. The container 116 may also include a container floor 126 connected to each of the first container wall 120, the second container wall 122, and the third container wall 124. Further, the container 116 may include a fourth container wall and a roof, but the fourth container wall and the roof are not shown in FIG. 1 so as to illustrate and describe one or more details associated with an interior of the container 116. Additionally, the container 116 includes an inlet port 128, e.g., on the first container wall 120, to draw air into the container 116 to cool the electrical components 102 and an exhaust port 130, e.g., on the second container wall 122, which may include one or more venting devices, such as an exhaust fan (not shown), to vent out or release a volume of air, which has been used to cool the electrical components 102, out of the container 116.

The containerized energy storage system 100 further includes a cooling system 140 for the electrical components 102 for cooling the electrical components 102. Although not limited, the cooling system 140 may be positioned on the container floor 126. The cooling system 140 may be applied to cool the electrical components 102 and keep the temperature of the electrical components 102 at an optimal level or at a level which is suitable for operations of the electrical components 102. The cooling system 140 will now be described in greater detail in the forthcoming disclosure.

Figure 3:
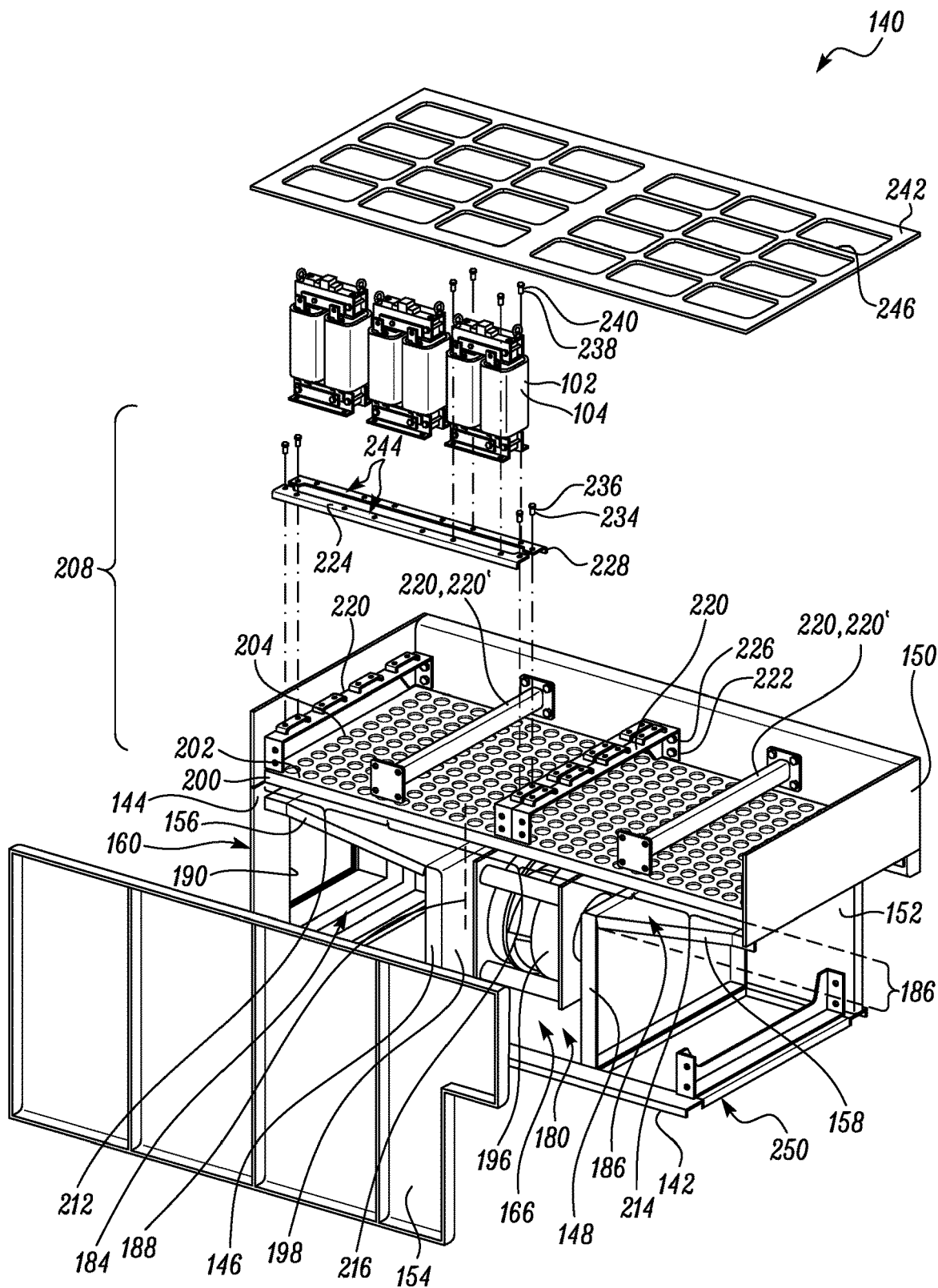
FIGS. 3 and 4 are various exploded views of the cooling system, in accordance with an embodiment of the present disclosure.
Figure 4:
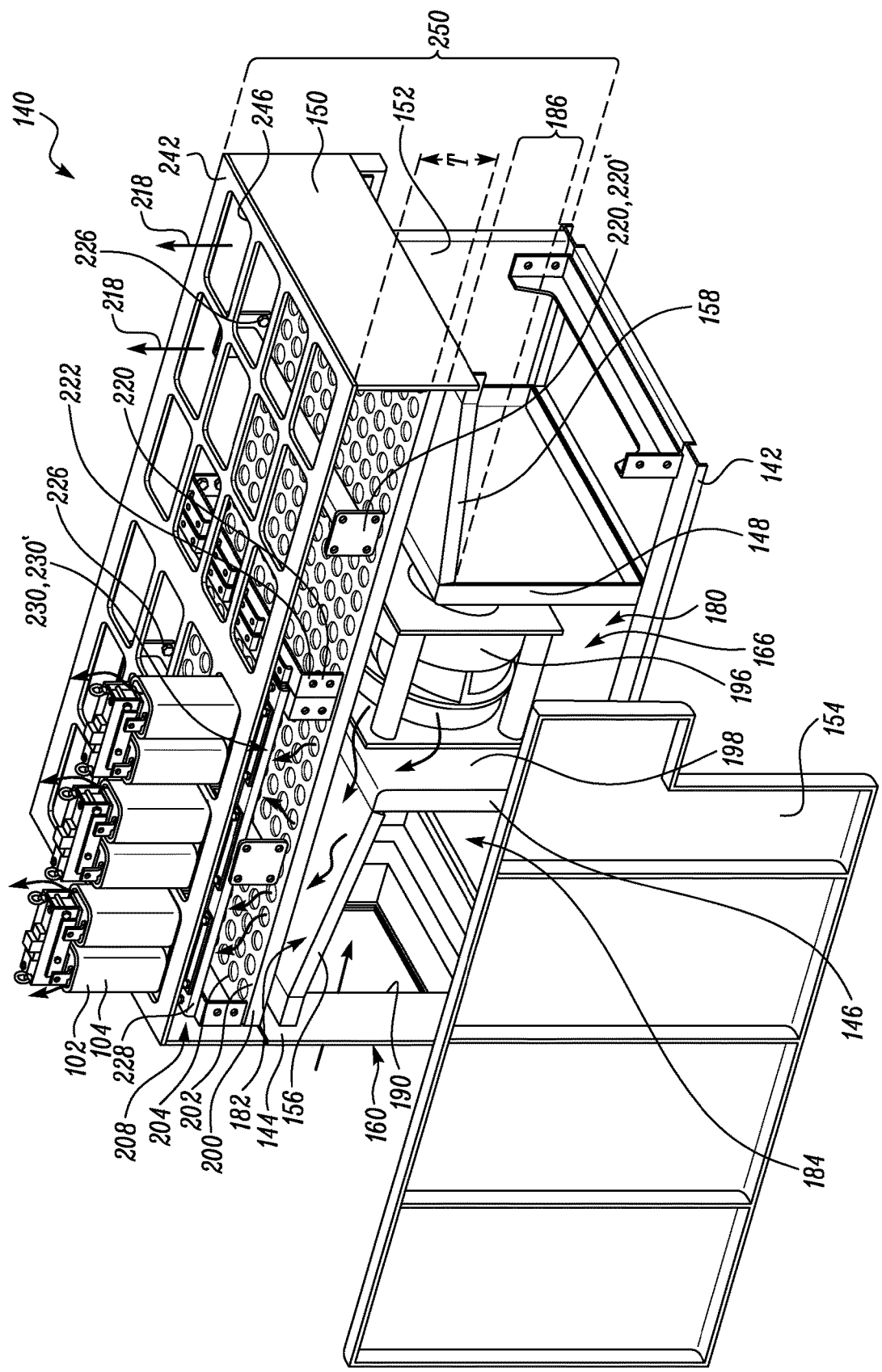

Referring to FIGS. 2 through 4, the cooling system 140 includes a casing 160 having a base 142 and a number of outer walls, for example, a first outer wall 144, a second outer wall 150, a third outer wall 152 (shown in FIGS. 3 and 4), and a fourth outer wall 154 (shown in FIGS. 3 and 4). One or more of the first outer wall 144, the second outer wall 150, the third outer wall 152, and the fourth outer wall 154 may be positioned upright with respect to the base 142. The first outer wall 144 may be located opposite to the second outer wall 150 and the third outer wall 152 may be located opposite to the fourth outer wall 154 (shown in FIGS. 3 and 4). Together, the outer walls 144, 150, 152, 154 may impart a generally rectangular configuration to the casing 160. The cooling system 140 also includes internal sidewalls, such as, a first sidewall 156, a second sidewall 158, a third sidewall 146, and a fourth sidewall 148. The first sidewall 156 and the second sidewall 158 may be disposed oppositely to each other. The first sidewall 156 may be connected to the first outer wall 144, while the second sidewall 158 may be connected to the second outer wall 150. The first sidewall 156 may be inclined with respect to the third sidewall 146 while the second sidewall 158 may be inclined with respect to the fourth sidewall 148, respectively. In accordance with various embodiments, the first sidewall 156 and the second sidewall 158 may respectively define a first angle 162 and a second angle 164 with respect to the third sidewall 146 and the fourth sidewall 148 of the cooling system 140. The first angle 162 may be equal to the second angle 164.

The outer walls 144, 150, 152, 154, the internal walls 146, 148, 156, 158, and the base 142, may collectively define a plenum 166 in the casing 160 of the cooling system 140. The plenum 166 may include various chambers 180, 182, 184 defined in the casing 160 of the cooling system 140. For example, a primary chamber 180 is formed by a portion of the base 142, the third sidewall 146, the fourth sidewall 148, a portion of the third outer wall 152, and a portion of the fourth outer wall 154. In that manner, the base 142, the third sidewall 146, the fourth sidewall 148, a portion of the third outer wall 152, and a portion of the fourth outer wall 154 may surround a volume of the primary chamber 180. A secondary chamber 182 is formed by the first sidewall 156, the second sidewall 158, a portion of the third outer wall 152, and a portion of the fourth outer wall 154 in conjunction with respective portions of the first outer wall 144 and the second outer wall 150. In accordance with various embodiments, given that the first sidewall 156 and the second sidewall 158 may be inclined with respect to the third sidewall 146 and the fourth sidewall 148, the secondary chamber 182 may define a structural section 186 diverging away and outwardly from the primary chamber 180, as shown.

Further, an auxiliary chamber 184 may be formed by the first outer wall 144, a portion of the base 142, the third sidewall 146, the first sidewall 156, a portion of the third outer wall 152, and a portion of the fourth outer wall 154.

The auxiliary chamber 184 may define a passage 194 for air flow to enter into the casing 160. In this regard, the auxiliary chamber 184 may define an inlet opening 190 for the passage 194 and an outlet opening 192 for the passage 194. The inlet opening 190 and the outlet opening 192 may be provided respectively on the first outer wall 144 and the third sidewall 146 of the cooling system 140.

The cooling system may also include a blower 196. The blower 196 may be installed at the outlet opening 192 of the third sidewall 146 in the primary chamber 180. As an example, the blower 196 may be installed on a side 198 of the third sidewall 146 that faces the primary chamber 180. Effectively, but not limited to, the blower 196 may be positioned inside the primary chamber 180. The blower 196 may include a centrifugal fan that may use centrifugal force to generate an air flow and move the air flow out of the primary chamber 180. Although not shown, other blower types may be contemplated, and the blower 196 is not limited to a centrifugal fan. It would be thus appreciated that the blower 196 may include any fan capable of drawing air flow into the primary chamber 180 from the auxiliary chamber 184 through the passage 194 and then pushing and moving the air flow out of the primary chamber 180 into the secondary chamber 182 of the plenum 166.

The cooling system 140 may further include a diffuser 200. The diffuser 200 may diffuse the air flow received from the secondary chamber 182 and uniformly distribute the air flow towards each electrical component 102 arranged on a platform 208 (discussed later) of the cooling system 140. The diffuser 200 may be located in fluid communication with the secondary chamber 182 and ahead of the secondary chamber 182 or downstream to the secondary chamber 182 along the air flow. In some embodiments, the diffuser 200 may be coupled to one or more of the outer walls 144, 150, 152, 154 to be defined towards or at one end of the secondary chamber 182. The diffuser 200 may include a perforated plate 202 (see FIGS. 2 through 4) that defines multiple air flow apertures 204 (see FIGS. 3 and 4). The air flow apertures 204 may correspond to holes, which may be of the same size and shape, although variations to the size and/or the shape of one or more air flow aperture 204 with respect to one or more other air flow apertures 204 of the diffuser 200 may be contemplated.

In one example, as shown in FIG. 3, the diffuser 200 may define a first segment 212 lying adjacent to the first outer wall 144, a second segment 214 lying adjacent to the second outer wall 150 and an intermediate segment 216, which may define a mid-region 188 of the diffuser 200, extending between the first segment 212 and the second segment 214. In some embodiments, cross-sectional areas of the air flow apertures 204 in the intermediate segment 216 may be smaller than cross-sectional areas of the air flow apertures 204 of the first segment 212 and the second segment 214. In some embodiments, cross-sectional areas of the air flow apertures 204 may increase (e.g., incrementally increase) from the mid-region 188 towards corresponding and opposite ends of the diffuser 200 as may be defined by each of the first segment 212 and second segment 214.

Referring to FIGS. 2 through 5, the cooling system 140 may further include the platform 208. The platform 208 may be applied to mount the electrical components 102. In an exemplary embodiment, the electrical components 102 may be arranged in a two-dimensional array 210 on the platform 208. The air flow apertures 204 of the diffuser 200 and/or the diffuser 200 itself may be disposed at a uniform offset, T, (shown in FIGS. 2 and 4) with respect to the two-dimensional array 210 of the electrical components 102 mounted on the platform 208. Moreover, the diffuser 200 may be disposed between the secondary chamber 182 of the plenum 166 and the platform 208.

According to some embodiments, the platform 208 may include a number of spaced apart beams 220 arranged in a planar configuration. The beams 220 may be mounted further ahead or downstream of the diffuser 200 along a direction of air flow. In some embodiments, the beams 220 may be mounted ahead of the diffuser 200 along a direction of air flow by coupling ends or edges 222 of the beams 220 to a portion of the third outer wall 152 and a portion of the fourth outer wall 154. The coupling can be attained by, but not limited to, welding and/or the use fasteners (e.g., threaded fasteners) 226 (shown in FIGS. 3 and 4). The beams 220 can be made from a variety of materials, such as, metal or an alloy, to provide rigidity and stability for mounting the electrical components 102 on the platform 208.

In some embodiments, the platform 208 may include links 228. The links 228 may define a mounting surface 224 for mounting the electrical components 102 on the platform 208. The links 228 may be arranged across the spaced apart beams 220 to define a grid formation 230 (shown in FIGS. 4 and 5) with the spaced apart beams 220. In some embodiments, each grid 230' (only one marked, see FIG. 5) in the grid formation 230 defines a spot 244 (see FIG. 5) on the platform 208 for mounting one or more electrical components 102 and further each grid 230' formed by the links 228 may also define an unrestricted through-passage 248 (see FIG. 5) for the air flow to pass therethrough to reach up to the corresponding electrical component 102 and then further pass through the clearance 110 associated with the corresponding electrical component 102.

Figure 5:
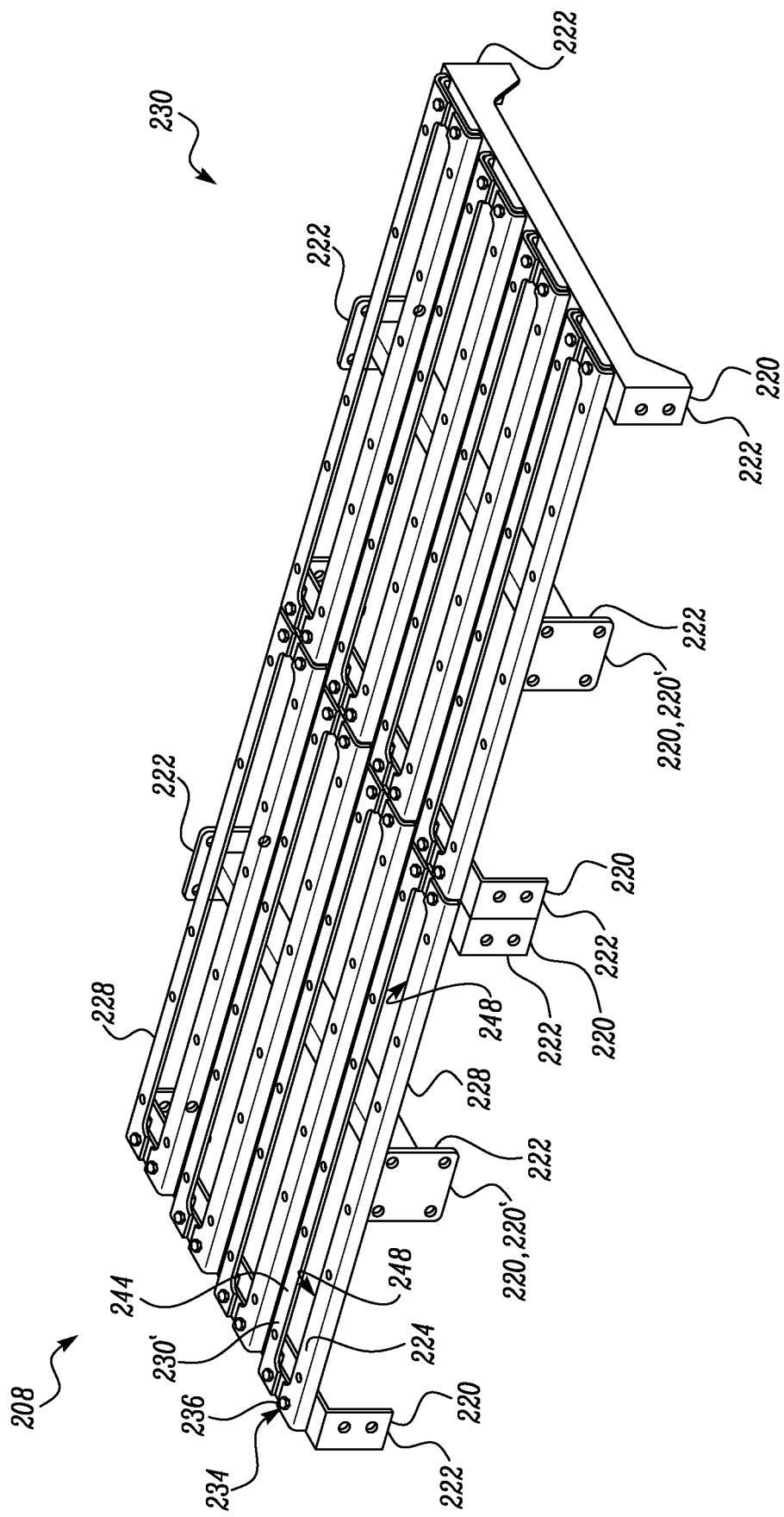
FIG. 5 is a perspective view of a platform for mounting the electrical components in the cooling system, in accordance with an embodiment of the present disclosure.

The links 228 may be securely coupled to the beams 220 using various fastening mechanism 234, such as, but not limited, to the use of fasteners 236 (shown in FIGS. 3 and 5). The links 228 may be configured to mount the electrical components 102 thereon. The links 228 may be configured to arrange the electrical components 102 on the platform 208 in a variety of configurations. For example, the links 228 may be configured to arrange the electrical components 102 in the two-dimensional array 210 on the platform 208. For this purpose, the platform 208 may be planarly laid out. The electrical components 102 may be arranged on the links 228 using various fastening mechanisms 240, such as, by use of the fasteners 238 (shown in FIG. 3). In some embodiments, the links 228 may be adjustable or removable with respect to the spaced apart beams 220, allowing for customization of the platform 208 and to accommodate different types or sizes of electrical components 102 on the platform 208. In some embodiments, one or more of the beams 220 (for example, beams 220') may simply support a weight of the platform 208 and the electrical components 102.

Referring back to FIGS. 2 through 4, the cooling system 140 further includes a cover 242 defining multiple slots 246 (shown in FIGS. 3 and 4). The slots 246 may correspondingly receive the electrical components 102 therethrough. It may be noted that as the electrical components 102 may be correspondingly received into the slots 246, the cover 242 may wrap around each electrical component 102 and provide a sealing around each electrical component 102. It is possible that the slots 246 correspondingly define an interference fit with the electrical components 102. The dimensions and size of each slot 246 may be configured to match the size of each electrical component 102. In some embodiments, the dimensions and size of one or more slots 246 can be modified and adjusted to surround electrical components 102 of various shapes and sizes.

In some embodiments, the interference fit and/or the sealing may be omitted. In such cases, the unrestricted through-passages 248 may direct at least a portion of the air flow towards and around the electrical components 102 (e.g., around the outer sheath 108, as well. In some embodiments, the cover 242 may be altogether omitted from the cooling system 140, and, in such cases also, the air flow may be directed towards and around the electrical components 102 (e.g., around the outer sheath 108) through the unrestricted through-passages 248.

It will be appreciated that the various elements of the cooling system 140, e.g., the primary chamber 180 and the secondary chamber 182, in conjunction with the diffuser 200 and the cover 242, may collectively define an arrangement 250 of the cooling system 140 that directs the air flow from the blower 196 towards the platform 208 and uniformly distribute the air flow to each electrical component 102 such that the air flow passes through the clearance 110 associated with each electrical component 102. Understandably, the direction of the air flow is enabled through the primary chamber 180 and the secondary chamber 182 of the plenum 166, and, more particularly, the structural section 186 which diverges outwardly and away from the primary chamber 180 towards the platform 208 directs the air flow from the primary chamber 180 towards the platform 208. The unrestricted through-passages 248 in conjunction with the slots 246 defined by the cover 242 define dedicated flow channels 218 (See FIG. 4) of the arrangement 250 that corresponds to the electrical components 102 such that each electrical component 102 may uniformly receive the air flow to attain uniform cooling.

INDUSTRIAL APPLICABILITY

Figure 6:
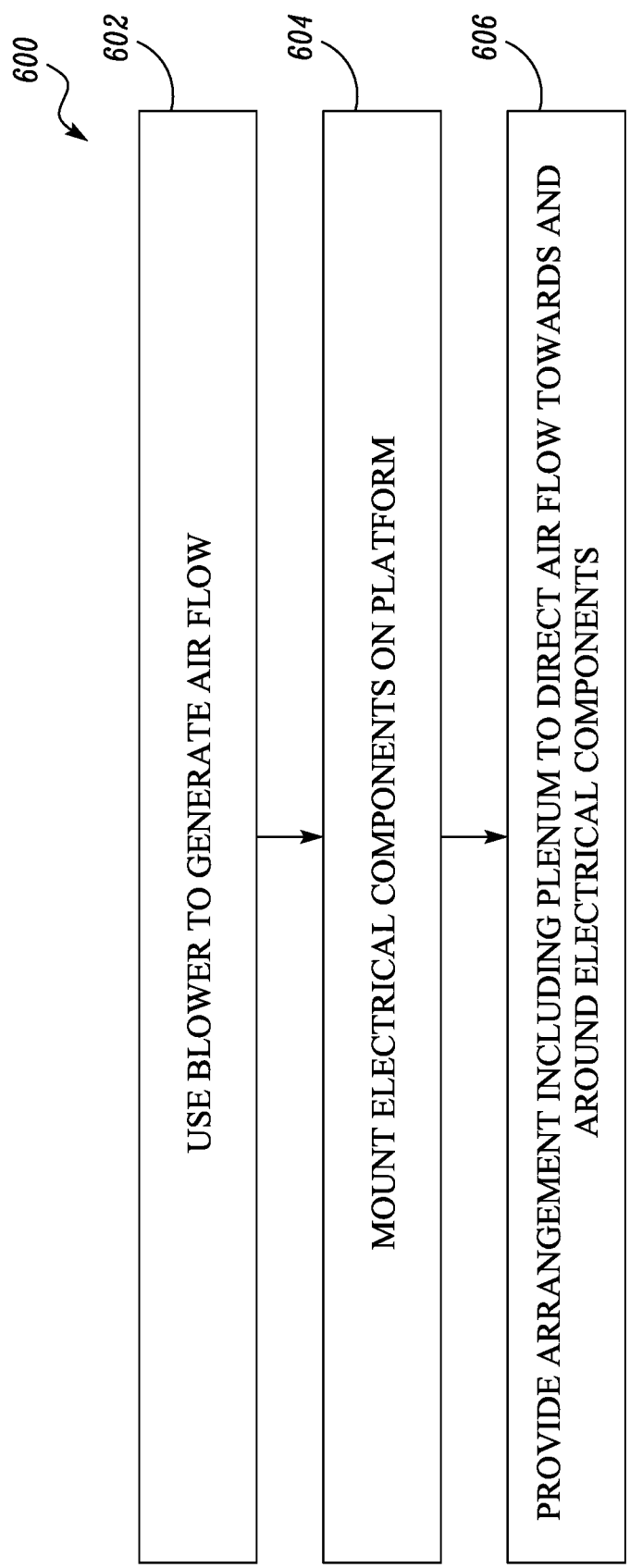
FIG. 6 is a method for cooling the electrical components by using the cooling system, in accordance with an embodiment of the present disclosure.

For cooling the electrical components 102, an operator may follow an exemplary method, which will now be described by way of a flowchart 600 in FIG. 6. References from FIGS. 1 through 5 may also be used. The method 600 includes using the blower 196 to generate an air flow (step 602). The method 600 further includes mounting the electrical components 102 on the platform 208 (step 604). Furthermore, the method 600 also includes providing the arrangement 250 including the plenum 166 to direct the air flow towards and around the electrical component 102 through the plurality of unrestricted through-passages 248 (step 606).

As part of an exemplary process to cool the electrical components 102 by way of the aforementioned exemplary elements of the cooling system 140, the blower 196 may be powered to run and generate a negative pressure (e.g., negative air pressure) within the auxiliary chamber 184 which causes air to be drawn in from the inlet port 128 of the container 116 and be further routed into the inlet opening 190 of the auxiliary chamber 184. This drawn-in air passes through the passage 194 and is then supplied to the outlet opening 192 of the cooling system 140. As the blower 196 continues to run, the blower 196 pulls in the air and generates an air flow which is then supplied into the primary chamber 180, thus creating positive pressure (e.g., positive air pressure) within the primary chamber 180. This positive air pressure causes the air flow generated by the blower 196 to be pushed out from the primary chamber 180 into the secondary chamber 182, e.g., with an associated velocity.

In the secondary chamber 182, owing to the divergent structural section 186 of the secondary chamber 182, the air flow is expanded and its progression or velocity is relatively slowed down such that the air flow can be distributed across an expanse of the secondary chamber 182. Given the continued push from the positive air pressure, the air flow collected in the secondary chamber 182 is forced towards the diffuser 200. At the diffuser 200, the air flow passes through the air flow apertures 204 and splits into multiple air flow streams. Also, the diffuser 200 diffuses the air flow received from the secondary chamber 182 and uniformly distributes the air flow towards each electrical component 102 arranged on the platform 208. At this point, the multiple air flow streams pass through the unrestricted through-passages 248 to reach up to the electrical components 102, i.e., each electrical component 102, and more particularly, up to the clearance 110 defined by each electrical component 102 to pass through the clearance 110 defined by each electrical component 102. In effect, the arrangement 250 uniformly distributes the air flow to each electrical component 102 such that the air flow passes through the clearance 110 associated with each electrical component 102.

Once the air flow passes out through the clearances 110, the air flow may be pushed and released outwards of each electrical component 102 into the inner volume 112 of the container 116. Given an operation of one or more venting devices placed at the exhaust port 130, this released air can then be pushed out from the container 116. To mitigate or altogether eliminate the chances for this released air to be redrawn into the cooling system 140 to impact the cooling efficiency of the cooling system 140 (since the released air may be carrying the heat of the electrical components 102 and may be hotter than the air drawn in by the blower 196 from the inlet opening 190), the cover 242 provides the sealing (e.g., by way of the interference fit) around each electrical component 102 to block or restrict the entry of said released air into the cooling system 140. In some embodiments, a duct (not shown) may be coupled between the inlet port 128 and the inlet opening 190 to isolate the air drawn in by the blower 196 from the air released by the cooling system 140.

The cooling system 140, as discussed in the aforesaid manner, provides the arrangement 250 that uniformly directs air to each electrical component 102. By way of defining the dedicated flow channels 218, the arrangement 250 allows the air flow to be uniformly delivered and passed through the clearances 110 associated with each electrical component 102. Such passage of the air flow forces out the heat trapped in the clearances 110, thus also efficiently cooling the electrical components 102 and increasing the electrical components' lifespan. Further, such cooling (e.g., the uniform cooling) attained also allows the electrical components 102 to be optimized for operations and/or for timely inspection and/or service. Moreover, the parts or elements of the cooling system 140, as described above, are easy to procure, fabricate, and/or construct, thus the cooling system 140 can be built relatively easily, i.e., with minimum skill, and by incurring relatively less cost.

It will be apparent to those skilled in the art that various modifications and variations can be made to the method and/or system of the present disclosure without departing from the scope of the disclosure. Other embodiments will be apparent to those skilled in the art from consideration of the specification and practice of the method and/or system disclosed herein. It is intended that the specification and examples be considered as exemplary only, with a true scope of the disclosure being indicated by the following claims and their equivalent.

What is claimed is:

1. A cooling system for a plurality of electrical components, the cooling system comprising:
   a blower to generate an air flow;
   a platform to mount the plurality of electrical components, the platform defining a plurality of passages; and
   an arrangement including a plenum extending between the blower and the platform to direct the air flow towards and around the plurality of electrical components through the plurality of passages, wherein the plenum includes:
   a primary chamber to receive the air flow from the blower; and
   a secondary chamber defining a structural section diverging outwardly and away from the primary chamber towards the platform to direct the air flow from the primary chamber towards the platform.

2. The cooling system of claim 1, wherein the primary chamber includes a base and a plurality of walls positioned upright with respect to the base, the plurality of walls and the base surrounding a volume of the primary chamber, and the structural section of the secondary chamber includes a first sidewall and a second sidewall disposed oppositely to each other, each of the first sidewall and the second sidewall being inclined with respect to corresponding walls of the plurality of walls of the primary chamber to define the structural section diverging away and outwardly from the primary chamber towards the platform, wherein the first sidewall and the second sidewall respectively define a first angle and a second angle with respect to the corresponding walls, the first angle being equal to the second angle.

3. The cooling system of claim 1, wherein the arrangement includes: a diffuser disposed between the secondary chamber of the plenum and the platform, the diffuser including a perforated plate defining a plurality of air flow apertures to diffuse the air flow received from the secondary chamber of the plenum and uniformly distribute the air flow towards each electrical component mounted on the platform.

4. The cooling system of claim 1, wherein
   the platform includes a plurality of spaced apart beams arranged in a planar configuration,
      a plurality of links arranged across the plurality of spaced apart beams to define a grid formation with the plurality of spaced apart beams, the plurality of links is configured to mount the plurality of electrical components thereon to arrange the plurality of electrical components on the platform, and
   the plurality of links arranged across the plurality of spaced apart beams defines the plurality of passages for the air flow to pass therethrough and reach up to the plurality of electrical components.

5. The cooling system of claim 1, wherein the arrangement includes a cover defining a plurality of slots to correspondingly receive the plurality of electrical components therethrough and have the cover wrap around and provide a sealing around each electrical component, the sealing restricting the air flow directed around the plurality of electrical components from being redrawn into the cooling system.

6. A containerized energy storage system, comprising:
   a plurality of electrical components;
   a container to house the plurality of electrical components, the container including an inlet port to draw air into the container and an exhaust port to release air out of the container;

a cooling system for the plurality of electrical components, the cooling system including:
a blower to generate an air flow;
a platform to mount the plurality of electrical components, the platform defining a plurality of passages; and
an arrangement including a plenum extending between the blower and the platform to direct the air flow towards and around the plurality of electrical components through the plurality of passages, wherein the plenum includes:
a primary chamber to receive the air flow from the blower; and
a secondary chamber defining a structural section diverging outwardly and away from the primary chamber.

7. The containerized energy storage system of claim 6, wherein
the secondary chamber directs air flow towards the platform.

8. The containerized energy storage system of claim 7, wherein
the primary chamber includes a base and a plurality of walls positioned upright with respect to the base, the plurality of walls and the base surrounding a volume of the primary chamber, and
the structural section of the secondary chamber includes a first sidewall and a second sidewall disposed oppositely to each other, each of the first sidewall and the second sidewall being inclined with respect to corresponding walls of the plurality of walls of the primary chamber to define the structural section diverging away and outwardly from the primary chamber towards the platform, wherein
the first sidewall and the second sidewall respectively define a first angle and a second angle with respect to the corresponding walls, the first angle being equal to the second angle.

9. The containerized energy storage system of claim 7, wherein the arrangement includes:
a diffuser disposed between the secondary chamber of the plenum and the platform, the diffuser including a perforated plate defining a plurality of air flow apertures to diffuse the air flow received from the secondary chamber of the plenum and uniformly distribute the air flow towards each electrical component mounted on the platform.

10. The containerized energy storage system of claim 9, wherein the plurality of electrical components are arranged in a two-dimensional array on the platform, and wherein the plurality of air flow apertures are disposed at a uniform offset with respect to the two-dimensional array of the plurality of electrical components.

11. The containerized energy storage system of claim 6, wherein
the platform includes a plurality of spaced apart beams arranged in a planar configuration,
a plurality of links arranged across the plurality of spaced apart beams to define a grid formation with the plurality of spaced apart beams, the plurality of links is configured to mount the plurality of electrical components thereon to arrange the plurality of electrical components on the platform, and
the plurality of links arranged across the plurality of spaced apart beams defines the plurality of passages for the air flow to pass therethrough and reach up to the plurality of electrical components.

12. The containerized energy storage system of claim 6, wherein the arrangement includes a cover defining a plurality of slots to correspondingly receive the plurality of electrical components therethrough and have the cover wrap around and provide a sealing around each electrical component, the sealing restricting the air flow directed around the plurality of electrical components from being redrawn into the cooling system.

13. The containerized energy storage system of claim 6, wherein each electrical component of the plurality of electrical components includes a core and an outer sheath surrounding and defining a clearance between the outer sheath and the core, and wherein the plenum directs the air flow to pass through the clearance associated with each electrical component.

14. A method for cooling a plurality of electrical components, the method comprising:
using a blower to generate an air flow;
mounting the plurality of electrical components on a platform, the platform defining a plurality of passages;
providing an arrangement including a plenum extending between the blower and the platform to direct the air flow towards and around the plurality of electrical components through the plurality of passages;
drawing air flow through a primary chamber by use of the blower; and
pushing air flow from the primary chamber to a secondary chamber, the secondary chamber defining a structural section diverging outwardly and away from the primary chamber.

15. The method of claim 14, wherein the primary chamber and the secondary chamber of the plenum includes:
the primary chamber includes a base and a plurality of walls positioned upright with respect to the base, the plurality of walls and the base surrounding a volume of the primary chamber, and
the structural section of the secondary chamber includes a first sidewall and a second sidewall disposed oppositely to each other, each of the first sidewall and the second sidewall being inclined with respect to corresponding walls of the plurality of walls of the primary chamber to define the structural section diverging away and outwardly from the primary chamber towards the platform.

16. The method of claim 15, wherein the first sidewall and the second sidewall respectively define a first angle and a second angle with respect to the corresponding walls, the first angle being equal to the second angle.

17. The method of claim 15, wherein the arrangement includes:
a diffuser disposed between the secondary chamber of the plenum and the platform, the diffuser including a perforated plate defining a plurality of air flow apertures to diffuse the air flow received from the secondary chamber of the plenum and uniformly distribute the air flow towards each electrical component mounted on the platform.

18. The method of claim 14, wherein
the platform includes a plurality of spaced apart beams arranged in a planar configuration,
a plurality of links arranged across the plurality of spaced apart beams to define a grid formation with the plurality of spaced apart beams, the plurality of links is configured to mount the plurality of electrical components thereon to arrange the plurality of electrical components on the platform, and
the plurality of links arranged across the plurality of spaced apart beams defines the plurality of passages for the air flow to pass therethrough and reach up to the plurality of electrical components.

19. The method of claim 14, wherein the arrangement includes a cover defining a plurality of slots to correspondingly receive the plurality of electrical components therethrough and have the cover wrap around and provide a sealing around each electrical component, the sealing restricting the air flow directed around the plurality of electrical components from being redrawn into the cooling system.

* * * * *